United States Patent
Choi et al.

(10) Patent No.: US 10,925,155 B2
(45) Date of Patent: Feb. 16, 2021

(54) PRINTED CIRCUIT BOARD AND DISPLAY DEVICE INCLUDING THE SAME

(71) Applicant: SAMSUNG DISPLAY CO., LTD., Yongin-si (KR)

(72) Inventors: Munsik Choi, Seoul (KR); Ki-Soo Nam, Asan-si (KR); Hanyul Yu, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 106 days.

(21) Appl. No.: 16/227,723

(22) Filed: Dec. 20, 2018

(65) Prior Publication Data

US 2019/0200447 A1 Jun. 27, 2019

(30) Foreign Application Priority Data

Dec. 27, 2017 (KR) .................. 10-2017-0181002

(51) Int. Cl.
*H05K 1/02* (2006.01)
*H05K 1/14* (2006.01)

(52) U.S. Cl.
CPC ............. *H05K 1/028* (2013.01); *H05K 1/144* (2013.01); *H05K 2201/041* (2013.01); *H05K 2201/056* (2013.01); *H05K 2201/10136* (2013.01)

(58) Field of Classification Search
CPC .. H05K 1/025; H05K 1/144; H05K 2201/041; H05K 2201/04; H05K 2201/0561; H05K 2201/10136
See application file for complete search history.

(56) References Cited

U.S. PATENT DOCUMENTS

| 2005/0122700 | A1* | 6/2005 | Kim | ................. | H05K 3/361 361/795 |
| 2011/0247863 | A1* | 10/2011 | Watanabe | ............ | H05K 3/1216 174/254 |
| 2014/0334164 | A1* | 11/2014 | Miyata | ................. | H05K 1/0256 362/382 |
| 2015/0362769 | A1 | 12/2015 | Huang | | |

FOREIGN PATENT DOCUMENTS

| KR | 10-0864000 | 10/2008 |
| KR | 10-1570530 | 11/2015 |

* cited by examiner

*Primary Examiner* — Thanh Nhan P Nguyen
(74) *Attorney, Agent, or Firm* — F. Chau & Associates, LLC

(57) ABSTRACT

A printed circuit board includes: a first flexible base member; a first metal line disposed on the first flexible base member; a first plating line disposed on the first metal line and including a first connecting portion, a first interconnection portion extending from the first connecting portion, and a first bending portion extending from the first interconnection portion; a first protective layer covering the first interconnection portion and exposing the first connecting portion and the first bending portion; a connection part disposed on the first bending portion and connected to the first bending portion; a second protective layer extending from a side surface of the connection part; a second plating line disposed on the second protective layer; a second metal line disposed on the second plating line; and a second flexible base member disposed on the second metal line.

20 Claims, 12 Drawing Sheets

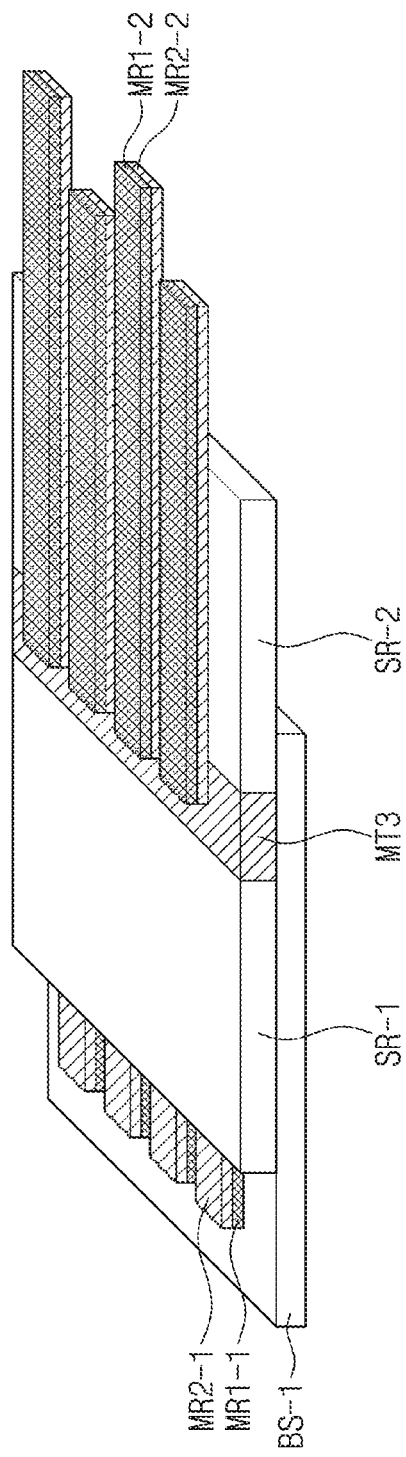

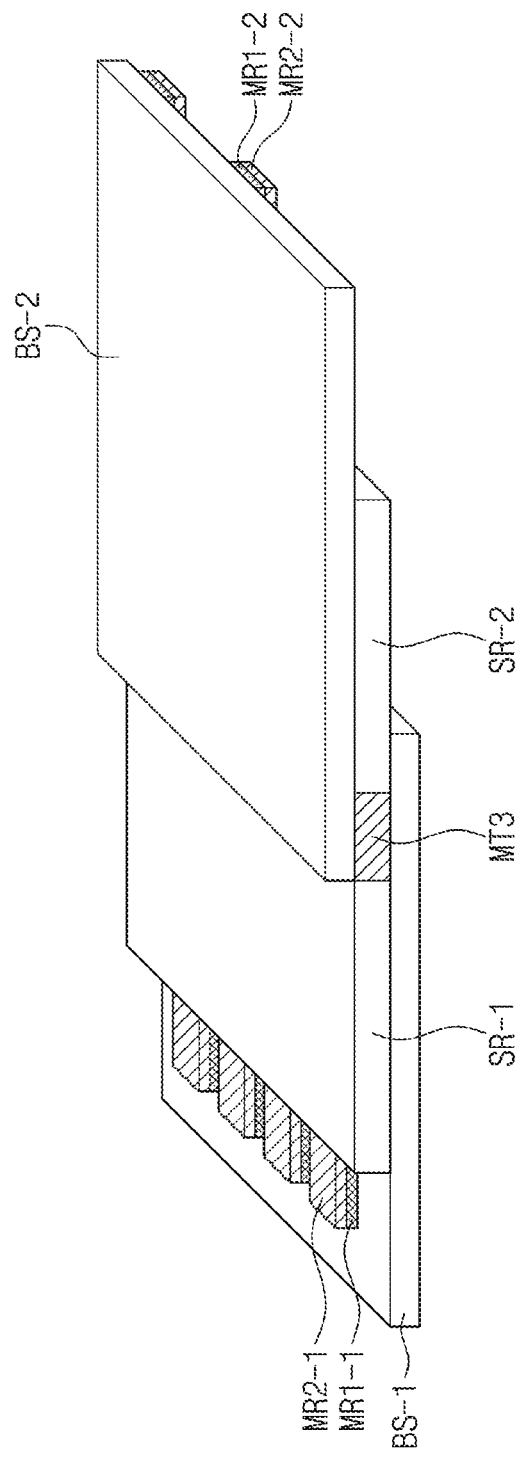

PRINTED CIRCUIT BOARD AND DISPLAY DEVICE INCLUDING THE SAME

CROSS-REFERENCE TO RELATED APPLICATION

This application claims priority under 35 U.S.C. § 119 to Korean Patent Application No. 10-2017-0181002, filed on Dec. 27, 2017 in the Korean Intellectual Property Office, the disclosure of which is incorporated by reference herein in its entirety.

TECHNICAL FIELD

Exemplary embodiments of the inventive concept relate to a printed circuit board having flexibility and a display device including the same.

DISCUSSION OF RELATED ART

Pixels of a display panel may receive electrical signals from a driving circuit to emit light. The display panel and the driving circuit may be electrically connected to each other through a printed circuit board.

The printed circuit board may be flexible. Thus, a portion of the printed circuit board may be bonded to the display panel, and then, the printed circuit board may be bent such that another portion of the printed circuit board is disposed on a back surface of the display panel. When the printed circuit board is bent toward the back surface of the display panel, a crack may occur at a bent portion of the printed circuit board and/or a bonded portion of the printed circuit board may be separated. Accordingly, signals may not be normally transferred between the display panel and the driving circuit, thus causing failure of the display panel.

SUMMARY

According to an exemplary embodiment of the inventive concept, a printed circuit board may include a first flexible base member, a first metal line, a first plating line, a first protective layer, a connection part, a second protective layer, a second plating line, a second metal line, and a second flexible base member. The first metal line may be disposed on the first flexible base member. The first plating line may be disposed on the first metal line, and may include a first connecting portion, a first interconnection portion extending from the first connecting portion, and a first bending portion extending from the first interconnection portion. The first protective layer may cover the first interconnection portion and may expose the first connecting portion and the first bending portion. The connection part may be disposed on the first bending portion and may be connected to the first bending portion. The second protective layer may extend from a side surface of the connection part. The second plating line may be disposed on the second protective layer. The second metal line may be disposed on the second plating line. The second flexible base member may be disposed on the second metal line.

The second plating line may include a second bending portion connected to the connection part, a second interconnection portion extending from the second bending portion, and a second connecting portion extending from the second interconnection portion. The second protective layer may expose the second connecting portion.

The first plating line may be formed by plating of the first metal line and the second plating line may be formed by plating of the second metal line.

The first metal line and the second metal line may include copper (Cu).

The first plating line, the second plating line, and the connection part may include tin (Sn).

The first flexible base member and the second flexible base member may include polyimide.

The first protective layer and the second protective layer may include a silicone resin.

Each of the first metal line, the second metal line, the first plating line, and the second plating line may be provided in plurality.

According to an exemplary embodiment of the inventive concept, a printed circuit board may include a first sub-printed circuit board, a second sub-printed circuit board, and a connection part. Each of the first and second sub-printed circuit boards may include a flexible base member, a metal line disposed on the flexible base member, a plating line, and a protective layer. The plating line may be disposed on the metal line, and may include a connecting portion, an interconnection portion extending from the connecting portion, and a bending portion extending from the interconnection portion. The protective layer may cover the interconnection portion and may expose the connecting portion and the bending portion. The bending portion of the first sub-printed circuit board, the bending portion of the second sub-printed circuit board, and the connection part may overlap with one another when viewed in a plan view, and the connection part may electrically connect the bending portion of the first sub-printed circuit board to the bending portion of the second sub-printed circuit board.

The plating line may be formed by plating of the metal line.

The metal line may include copper (Cu), and the plating line may include tin (Sn).

The connection part may include tin (Sn).

The flexible base member may include polyimide.

The protective layer may include a silicone resin.

According to an exemplary embodiment of the inventive concept, a display device may include a display panel, a backlight unit configured to provide light to the display panel, and a printed circuit board. The display panel may include a first substrate having a surface on which a plurality of color filters is disposed, and a second substrate. The second substrate may have a surface on which a plurality of transistors is disposed. The second substrate may include a pad part that is electrically connected to the printed circuit board to receive electrical signals provided from an outside to the plurality of transistors. The printed circuit board may include a first flexible base member, a first metal line, a first plating line, a first protective layer, a connection part, a second flexible base member, a second metal line, a second plating line, and a second protective layer. The first metal line may be disposed on a surface of the first flexible base member. The first plating line may be plated on the first metal line and may include a first connecting portion connected to the pad part, a first interconnection portion extending from the first connecting portion, and a first bending portion extending from the first interconnection portion. The first protective layer may cover the first interconnection portion. The connection part may cover the first bending portion. The second metal line may be disposed on a surface of the second flexible base member. The second plating line may be plated on the second metal line and may include a second bending portion connected to the connection part, a second interconnection portion extending from the second bending portion, and a second connecting portion extending from the second interconnection portion. The second protective layer may cover the second interconnection portion.

The display device may further include a driving circuit connected to the second connecting portion of the printed circuit board.

The connection part may overlap with the first bending portion and the second bending portion when viewed in a plan view, and the printed circuit board may be bent with respect to the connection part.

The first substrate may be disposed between the backlight unit and the second substrate.

The backlight unit may be disposed between the driving circuit and the first substrate.

The first and second metal lines may include copper (Cu), the first and second plating lines may include tin (Sn), and the first and second flexible base members may include polyimide.

BRIEF DESCRIPTION OF THE DRAWINGS

The above and other aspects and features of the inventive concept will become more apparent by describing in further detail exemplary embodiments thereof with reference to the accompanying drawings.

FIGS. 8A, 8B, 8C, 8D, 8E, 8F, 8G, 8H, and 8I are perspective views illustrating a method of manufacturing a printed circuit board according to an exemplary embodiment of the inventive concept.

DETAILED DESCRIPTION OF THE EMBODIMENTS

Figure 1:
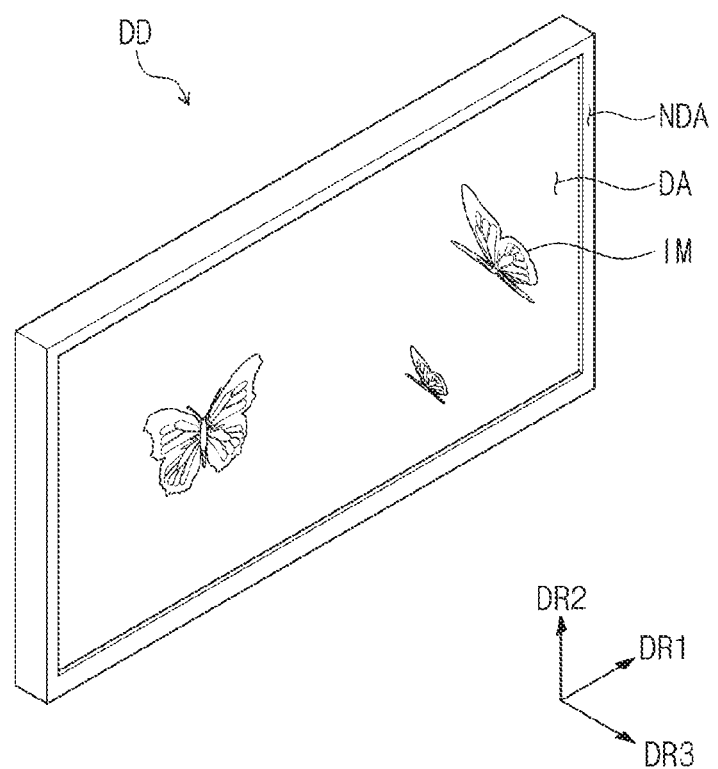
FIG. 1 is a perspective view illustrating a display device according to an exemplary embodiment of the inventive concept.

Exemplary embodiments of the inventive concept provide a printed circuit board capable of reducing cracks which may occur when the printed circuit board is bent, and a display device including the same.

Exemplary embodiments of the inventive concept will be described more fully hereinafter with reference to the accompanying drawings. Like reference numerals may refer to like elements throughout this application.

It will be understood that when an element such as a layer, region, or substrate is referred to as being "on" another element, it can be directly on the other element or intervening elements may be present. In contrast, the term "directly" means that there are no intervening elements.

Exemplary embodiments of the inventive concept are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments of the inventive concept should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive concept.

Figure 2:
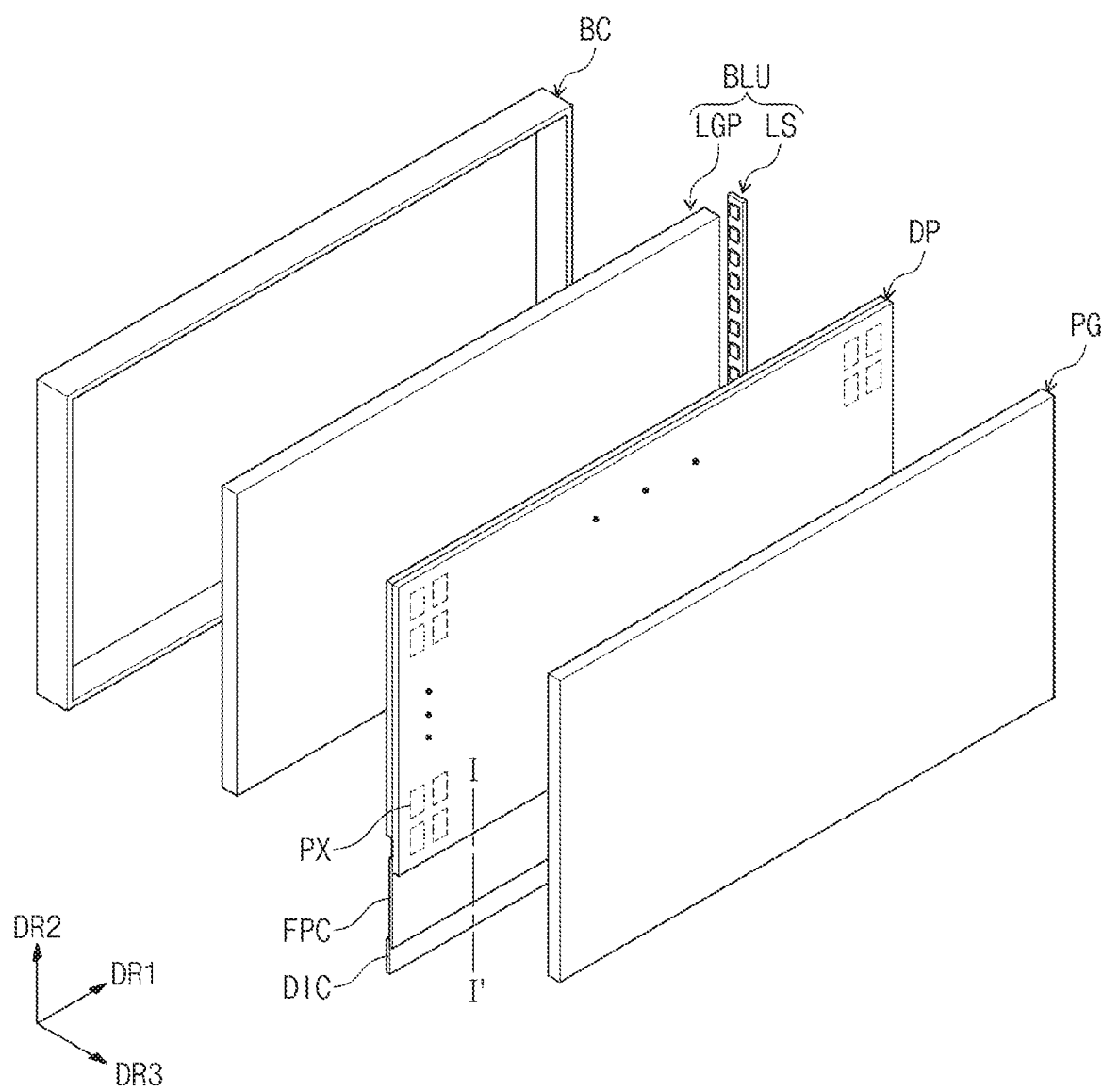
FIG. 2 is an exploded perspective view illustrating the display device of FIG. 1 according to an exemplary embodiment of the inventive concept.

FIG. 1 is a perspective view illustrating a display device according to an exemplary embodiment of the inventive concept. FIG. 2 is an exploded perspective view illustrating the display device of FIG. 1 according to an exemplary embodiment of the inventive concept.

A display device DD may be a liquid crystal display device, an organic light emitting display device, or a plasma display device. Hereinafter, it is assumed that the display device DD is a liquid crystal display device.

As illustrated in FIGS. 1 and 2, the display device DD may include a protective glass PG, a display panel DP, a printed circuit board FPC, a driving circuit DIC, a backlight unit BLU, and a bottom cover BC.

A display area DA may be defined in the display device DD. A plurality of pixels PX may be disposed in the display area DA. The display device DD may provide information of an image IM to a user through the display area DA. A butterfly is illustrated as an example of the image IM in FIG. 1.

The protective glass PG may protect the display panel DP. In an exemplary embodiment of the inventive concept, the protective glass PG may be replaced with a top cover. The top cover may expose a front surface of the display panel DP to define the display area DA.

The display panel DP may include the plurality of pixels PX. The pixels PX may transmit or block light provided from the backlight unit BLU in response to signals applied from the driving circuit DIC through the printed circuit board FPC.

The backlight unit BLU may provide light to the display panel DP. The backlight unit BLU may include a light source LS and a light guide plate LGP. The light guide plate LGP may guide light emitted from the light source LS toward the display panel DP.

In FIG. 2, the light source LS is disposed at a right side of the light guide plate LGP. However, the inventive concept is not limited thereto. In an exemplary embodiment of the inventive concept, the light source LS may be disposed at a bottom side, a top side or a left side of the light guide plate LGP.

In addition, the backlight unit BLU which is an edge type is illustrated as an example in FIG. 2. However, the inventive concept is not limited thereto. In an exemplary embodiment of the inventive concept, the backlight unit BLU may be a direct type.

The bottom cover BC may cover the display panel DP and the backlight unit BLU, and may protect the display panel DP and the backlight unit BLU from an external impact and/or a contaminant.

A plurality of optical sheets may be provided between the display panel DP and the backlight unit BLU. The optical sheets may change characteristics of light provided from the backlight unit BLU and may provide the light having the changed characteristics to the display panel DP.

Figure 3:
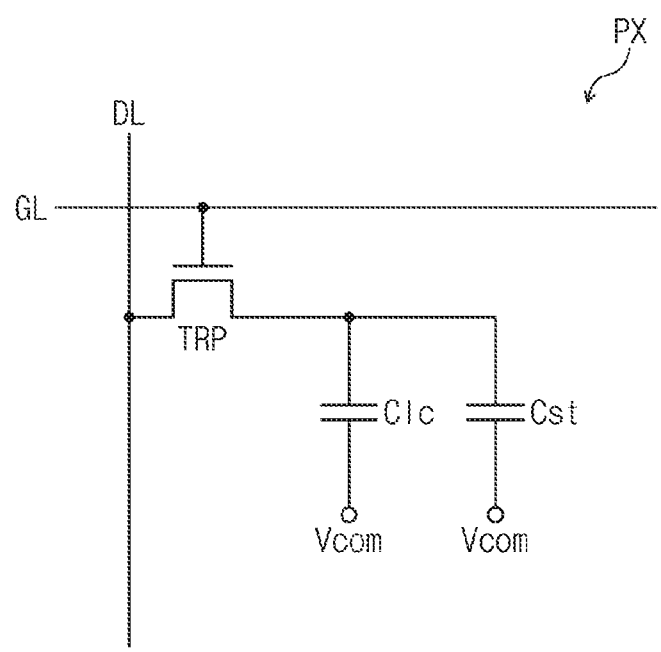
FIG. 3 is an equivalent circuit diagram illustrating a pixel of FIG. 2 according to an exemplary embodiment of the inventive concept.
Figure 4:
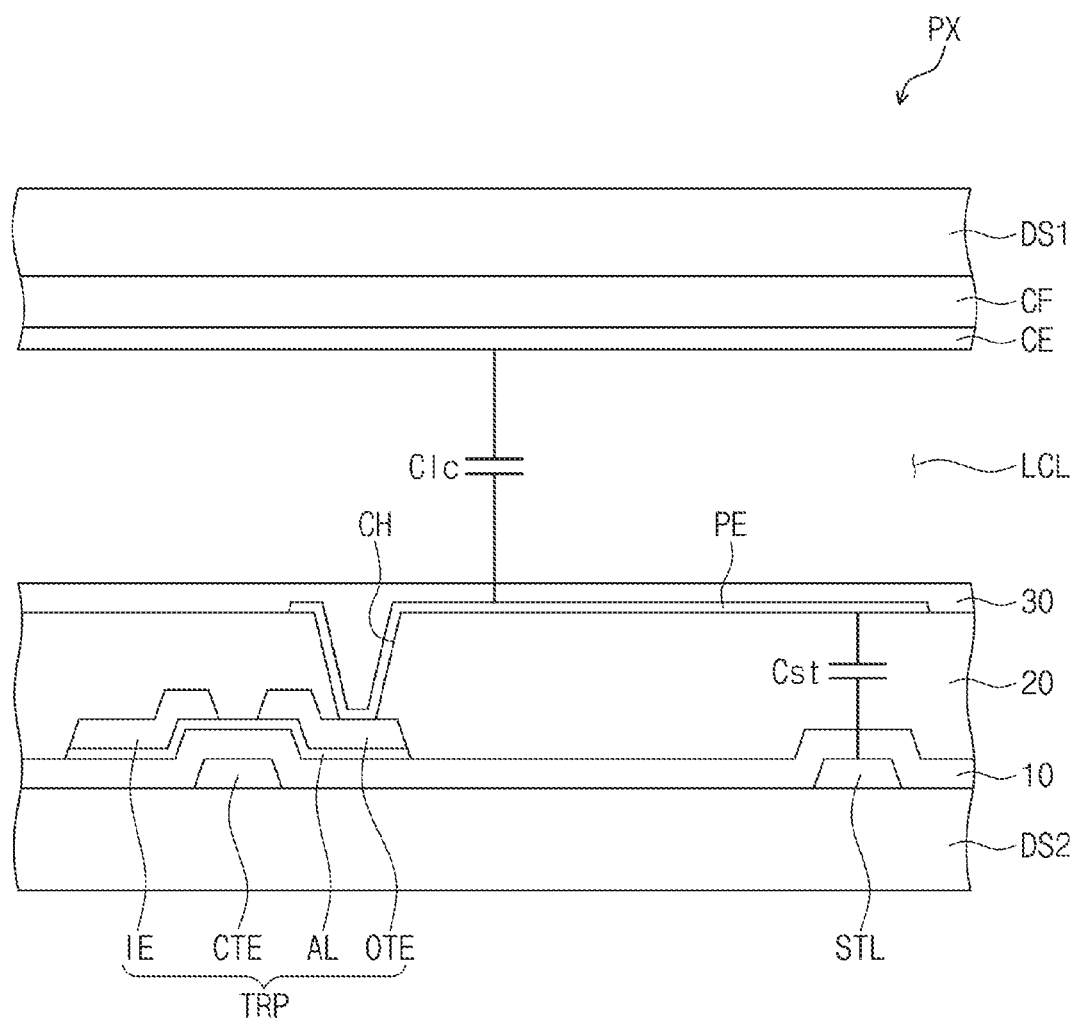
FIG. 4 is a cross-sectional view illustrating the pixel of FIG. 2 according to an exemplary embodiment of the inventive concept.

FIG. 3 is an equivalent circuit diagram illustrating a pixel of FIG. 2 according to an exemplary embodiment of the inventive concept. FIG. 4 is a cross-sectional view illustrating the pixel of FIG. 2 according to an exemplary embodiment of the inventive concept.

As illustrated in FIG. 3, the pixel PX may include a pixel transistor TRP, a liquid crystal capacitor Clc, and a storage capacitor Cst.

Hereinafter, a transistor may refer to a thin film transistor. In an exemplary embodiment of the inventive concept, the storage capacitor Cst may be omitted.

The pixel transistor TRP may output a pixel voltage, which corresponds to a data signal received from a data line DL, in response to a gate signal received from a gate line GL.

The liquid crystal capacitor Clc may store the pixel voltage outputted from the pixel transistor TRP. Arrangement of liquid crystal directors included in a liquid crystal layer LCL may be changed depending on the amount of charges stored in the liquid crystal capacitor Clc. Light incident to the liquid crystal layer LCL may be transmitted or blocked according to the arrangement of the liquid crystal directors.

The storage capacitor Cst may be connected in parallel to the liquid crystal capacitor Clc. The storage capacitor Cst may maintain the arrangement of the liquid crystal directors for a certain period.

As illustrated in FIG. 4, the pixel transistor TRP may include a control electrode CTE connected to the gate line GL, an active layer AL overlapping with the control electrode CTE, an input electrode IE connected to the data line DL, and an output electrode OTE spaced apart from the input electrode IE.

The liquid crystal capacitor Clc may include a pixel electrode PE and a common electrode CE. The storage capacitor Cst may include the pixel electrode PE and a portion of a storage line STL overlapping with the pixel electrode PE. A common voltage Vcom may be applied to the common electrode CE.

A color filter layer CF may be disposed on one surface of a first substrate DS1. The color filter layer CF may include a plurality of color filters. The common electrode CE may be disposed on one surface of the color filter layer CF.

An alignment layer covering the common electrode CE may be disposed on one surface of the common electrode CE. An additional insulating layer may be disposed between the color filter layer CF and the common electrode CE.

The control electrode CTE, the gate line GL, and the storage line STL may be disposed on one surface of a second substrate DS2. The control electrode CTE, the gate line GL, and the storage line STL may include a metal (e.g., aluminum (Al), silver (Ag), copper (Cu), molybdenum (Mo), chromium (Cr), tantalum (Ta), or titanium (Ti)) or any alloy thereof.

A first insulating layer 10 may be disposed on the one surface of the second substrate DS2 and may cover the control electrode CTE and the storage line STL. The first insulating layer 10 may include at least one of an inorganic material or an organic material. For example, the first insulating layer 10 may have a multi-layered structure including a silicon nitride layer and a silicon oxide layer.

The active layer AL overlapping with the control electrode CTE may be disposed on the first insulating layer 10. The active layer AL may include amorphous silicon or poly-silicon. Alternatively, the active layer AL may include a metal oxide semiconductor.

The output electrode OTE and the input electrode IE may be disposed on the active layer AL. The output electrode OTE and the input electrode IE may be spaced apart from each other.

The pixel transistor TRP having a staggered structure is illustrated as an example in FIG. 4. However, the structure of the pixel transistor TRP is not limited thereto. In an exemplary embodiment of the inventive concept, the pixel transistor TRP may have a planar structure.

A second insulating layer 20 may be disposed on the first insulating layer 10 and may cover the active layer AL, the output electrode OTE, and the input electrode IE. The second insulating layer 20 may provide a flat surface (e.g., a flat top surface). The second insulating layer 20 may include an organic material.

The pixel electrode PE may be disposed on the second insulating layer 20. The pixel electrode PE may be connected to the output electrode OTE through a contact hole CH penetrating the second insulating layer 20. An alignment layer 30 covering the pixel electrode PE may be disposed on the second insulating layer 20.

The pixel electrode PE and the common electrode CE, disposed with the liquid crystal layer LCL interposed therebetween, may form the liquid crystal capacitor Clc. In addition, the pixel electrode PE and the storage line STL, disposed with the first and second insulating layers 10 and 20 interposed therebetween, may form the storage capacitor Cst. The storage line STL may receive a storage voltage of which a value is different from that of the pixel voltage. The value of the storage voltage may be substantially equal to the value of the common voltage Vcom.

In an exemplary embodiment of the inventive concept, light emitted from the backlight unit BLU may pass through the first substrate DS1 and then may be provided to the second substrate DS2. However, the inventive concept is not limited thereto. In an exemplary embodiment of the inventive concept, the light emitted from the backlight unit BLU may pass through the second substrate DS2 and then may be provided to the first substrate DS1.

However, the cross section of the pixel PX of FIG. 4 is merely exemplary. Unlike FIG. 4, at least one of the color filter layer CF or the common electrode CE may be disposed on the second substrate DS2. In an exemplary embodiment of the inventive concept, the display panel may include a pixel of a vertical alignment (VA) mode, a patterned vertical alignment (PVA) mode, an in-plane switching (IPS) mode, a fringe-field switching (FFS) mode, or a plane-to-line switching (PLS) mode.

Figure 5:
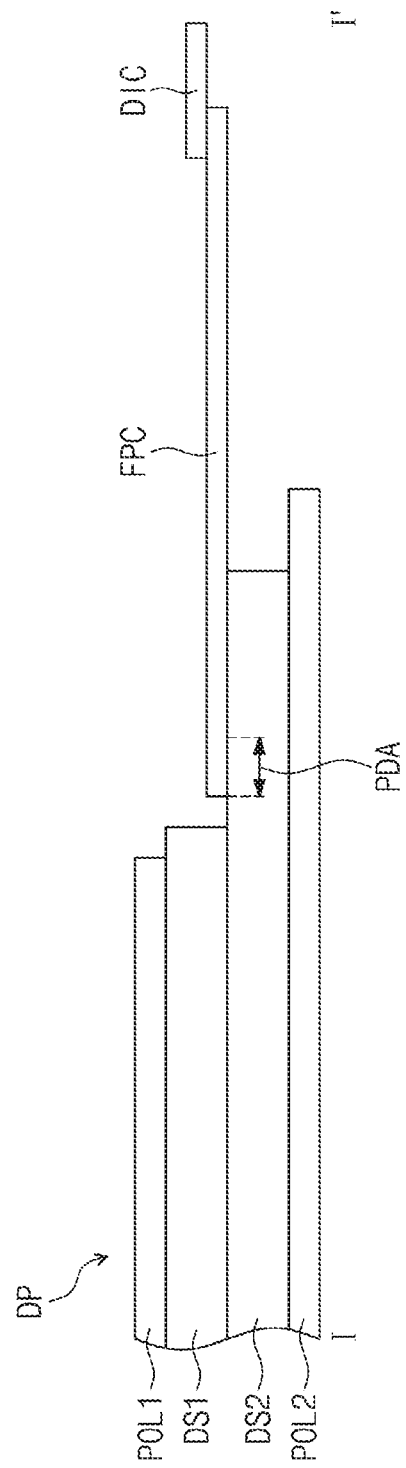
FIG. 5 is a cross-sectional view taken along a line I-I' of FIG. 2 according to an exemplary embodiment of the inventive concept.

FIG. 5 is a cross-sectional view taken along a line I-I' of FIG. 2 according to an exemplary embodiment of the inventive concept. FIG. 5 illustrates a connection relation between the display panel DP, the printed circuit board FPC, and the driving circuit DIC.

The components between the first and second substrates DS1 and DS2 are not illustrated in FIG. 5 for the purpose of ease and convenience in description and illustration.

The display panel DP may further include a first polarizing member POL1 disposed on a surface of the first substrate DS1 and a second polarizing member POL2 disposed on a surface of the second substrate DS2.

The display panel DP may include a pad part PDA. The pad part PDA may include a plurality of pads. The printed circuit board FPC may electrically connect the pad part PDA to the driving circuit DIC. The pixels PX may receive electrical signals from the driving circuit DIC through the printed circuit board FPC.

Figure 6:
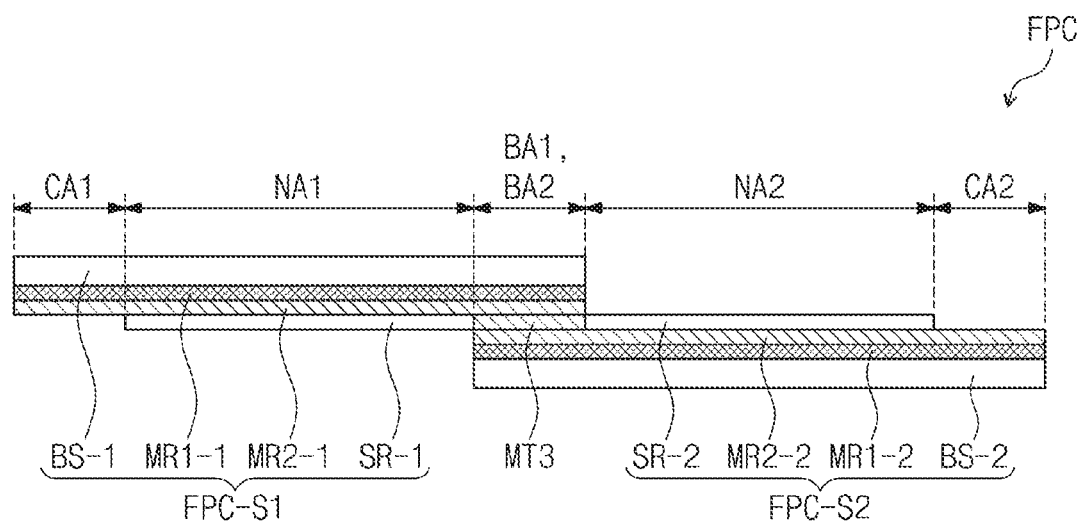
FIG. 6 is a cross-sectional view illustrating a printed circuit board of FIG. 4 according to an exemplary embodiment of the inventive concept.

FIG. 6 is a cross-sectional view illustrating a printed circuit board of FIG. 4 according to an exemplary embodiment of the inventive concept.

The printed circuit board FPC according to an exemplary embodiment of the inventive concept may include a first sub-printed circuit board FPC-S1, a second sub-printed circuit board FPC-S2, and a connection part MT3.

The first sub-printed circuit board FPC-S1 may be divided into a first connecting portion CA1, a first interconnection portion NA1, and a first bending portion BA1. The second sub-printed circuit board FPC-S2 may be divided into a second connecting portion CA2, a second interconnection portion NA2, and a second bending portion BA2.

The first bending portion BA1 of the first sub-printed circuit board FPC-S1 and the second bending portion BA2 of the second sub-printed circuit board FPC-S2 may be electrically connected to each other by the connection part MT3. The connection part MT3 may include tin (Sn).

The first sub-printed circuit board FPC-S1 may include a first flexible base member BS-1, first metal lines MR1-1, first plating lines MR2-1, and a first protective layer SR-1. The first flexible base member BS-1 may include polyimide.

The first metal lines MR1-1 may be disposed on one surface of the first flexible base member BS-1. In an exemplary embodiment of the inventive concept, the first metal lines MR1-1 may include copper (Cu).

The first plating lines MR2-1 may be lines plated on the first metal lines MR1-1. In an exemplary embodiment of the inventive concept, the first plating lines MR2-1 may include tin (Sn). In other words, the first plating lines MR2-1 may be lines which are formed by plating the first metal lines MR1-1 with tin (Sn).

The first protective layer SR-1 may cover portions of the first plating lines MR2-1, which correspond to the first interconnection portion NA1. The first protective layer SR-1 may prevent the first metal lines MR1-1 and the first plating lines MR2-1 from being damaged by an external material and/or an external impact. The first protective layer SR-1 may include a silicone resin. However, the inventive concept is not limited thereto. In an exemplary embodiment of the inventive concept, the first protective layer SR-1 may include at least one organic material and/or at least one inorganic material for protecting the first metal lines MR1-1 and the first plating lines MR2-1.

In the present specification, the first connecting portion CA1, the first interconnection portion NA1, and the first bending portion BA1 may refer to portions of the first plating lines MR2-1 for the purpose of ease and convenience in description.

The first protective layer SR-1 may not cover portions of the first plating lines MR2-1 that correspond to the first connecting portion CA1 and the first bending portion BA1. In other words, the first protective layer SR-1 may expose the portions of the first plating lines MR2-1 that correspond to the first connecting portion CA1 and the first bending portion BA1.

In an exemplary embodiment of the inventive concept, the first protective layer SR-1 may not be formed on the portions of the first plating lines MR2-1, which correspond to the first connecting portion CA1 and the first bending portion BA1, from the outset. In an exemplary embodiment of the inventive concept, the first protective layer SR-1 may also be formed on the portions of the first plating lines MR2-1, which correspond to the first connecting portion CA1 and the first bending portion BA1, and then, openings may be formed in the first protective layer SR-1 to expose the portions of the first plating lines MR2-1 corresponding to the first connecting portion CA1 and the first bending portion BA1.

The second sub-printed circuit board FPC-S2 may include a second flexible base member BS-2, second metal lines MR1-2, second plating lines MR2-2, and a second protective layer SR-2. The second flexible base member BS-2 may include polyimide.

The second metal lines MR1-2 may be disposed on one surface of the second flexible base member BS-2. In an exemplary embodiment of the inventive concept, the second metal lines MR1-2 may include copper (Cu).

The second plating lines MR2-2 may be lines plated on the second metal lines MR1-2. In an exemplary embodiment of the inventive concept, the second plating lines MR2-2 may include tin (Sn). In other words, the second plating lines MR2-2 may be lines which are formed by plating the second metal lines MR1-2 with tin (Sn).

The second protective layer SR-2 may cover portions of the second plating lines MR2-2, which correspond to the second interconnection portion NA2. The second protective layer SR-2 may prevent the second metal lines MR1-2 and the second plating lines MR2-2 from being damaged by an external material and/or an external impact. The second protective layer SR-2 may include a silicone resin. However, the inventive concept is not limited thereto. In an exemplary embodiment of the inventive concept, the second protective layer SR-2 may include at least one organic material and/or at least one inorganic material for protecting the second metal lines MR1-2 and the second plating lines MR2-2.

The second protective layer SR-2 may not cover portions of the second plating lines MR2-2 corresponding to the second connecting portion CA2 and the second bending portion BA2. In other words, the second protective layer SR-2 may expose the portions of the second plating lines MR2-2, which correspond to the second connecting portion CA2 and the second bending portion BA2.

In an exemplary embodiment of the inventive concept, the second protective layer SR-2 may not be formed on the portions of the second plating lines MR2-2, which correspond to the second connecting portion CA2 and the second bending portion BA2, from the outset. In an exemplary embodiment of the inventive concept, the second protective layer SR-2 may also be formed on the portions of the second plating lines MR2-2 which correspond to the second connecting portion CA2 and the second bending portion BA2, and then, openings may be formed in the second protective layer SR-2 to expose the portions of the second plating lines MR2-2, which correspond to the second connecting portion CA2 and the second bending portion BA2.

The first bending portion BA1 of the first sub-printed circuit board FPC-S1, the second bending portion BA2 of the second sub-printed circuit board FPC-S2, and the connection part MT3 may overlap with one another when viewed in a plan view.

In FIG. 6, the first metal line MR1-1 and the first plating line MR2-1 are illustrated as two different kinds of lines. However, in an exemplary embodiment of the inventive concept, the first metal line MR1-1 and the first plating line MR2-1 may be replaced with one kind of an alloy line. The alloy line may include $Cu_3Sn$ or $Cu_6Sn_5$.

The first and second plating lines MR2-1 and MR2-2 may increase flexibility of the first and second metal lines MR1-1 and MR1-2. In addition, flexibility of the alloy line including $Cu_3Sn$ or $Cu_6Sn_5$ may be greater than that of the first and second metal lines MR1-1 and MR1-2 including only copper (Cu).

Figure 7:
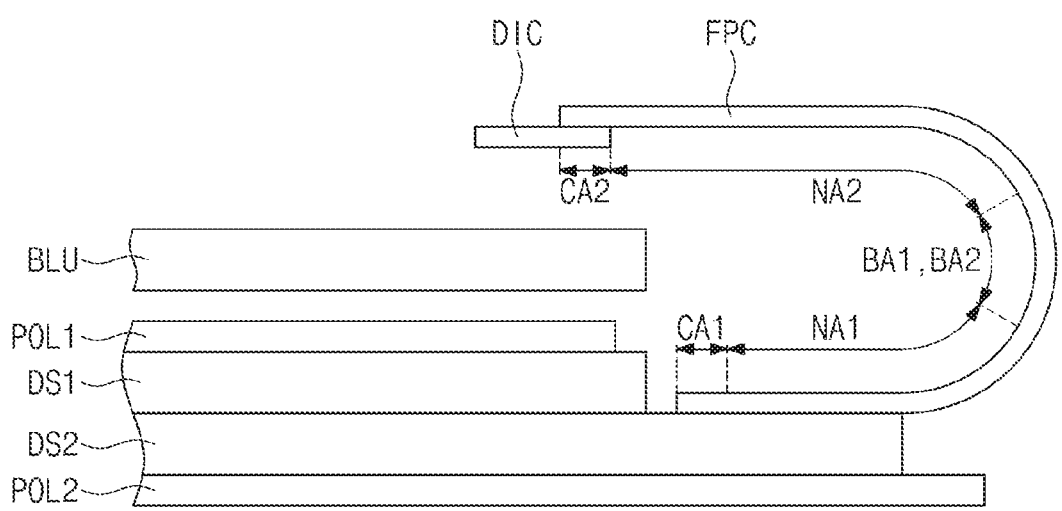
FIG. 7 is a cross-sectional view illustrating arrangement of a display panel, a backlight unit, a printed circuit board, and a driving circuit according to an exemplary embodiment of the inventive concept.

FIG. 7 is a cross-sectional view illustrating arrangement of a display panel, a backlight unit, a printed circuit board, and a driving circuit according to an exemplary embodiment of the inventive concept.

The printed circuit board FPC may be bent with respect to the first and second bending portions BA1 and BA2. At this time, since the printed circuit board FPC has a connection structure of the first and second metal lines MR1-1 and MR1-2 and the first and second plating lines MR2-1 and MR2-2 as illustrated in FIG. 6, a crack due to bending may not be generated.

In an exemplary embodiment of the inventive concept, the first substrate DS1 may be disposed between the backlight unit BLU and the second substrate DS2.

In an exemplary embodiment of the inventive concept, the backlight unit BLU may be disposed between the first substrate DS1 and the driving circuit DIC.

FIGS. 8A, 8B, 8C, 8D, 8E, 8F, 8G, 8H, and 8I are perspective views illustrating a method of manufacturing a printed circuit board according to an exemplary embodiment of the inventive concept.

Sequent order of processes will be mainly described with reference to FIGS. 8A to 8I. Hereinafter, shapes and materials of components may be substantially the same as those described with reference to FIG. 6, and thus the descriptions thereof will be omitted.

Figure 8A:
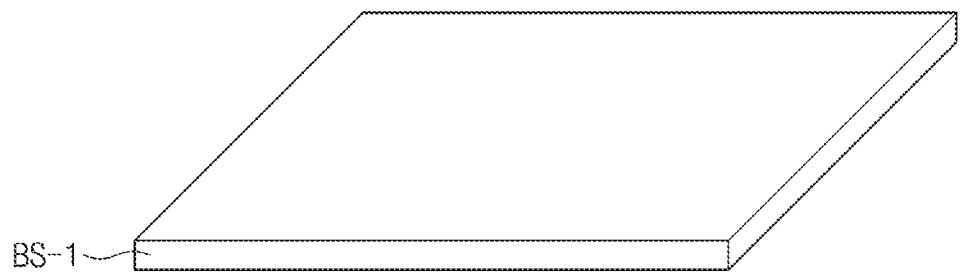
Figure 8B:
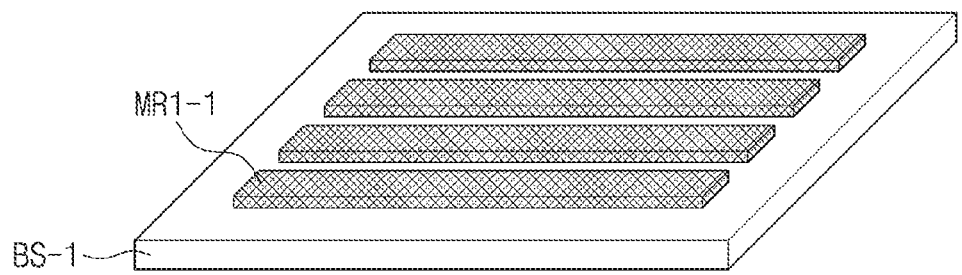

Referring to FIGS. 8A and 8B, first metal lines MR1-1 may be disposed or formed on the first flexible base member BS-1. The first metal lines MR1-1 may be disposed in parallel to one another.

Figure 8C:
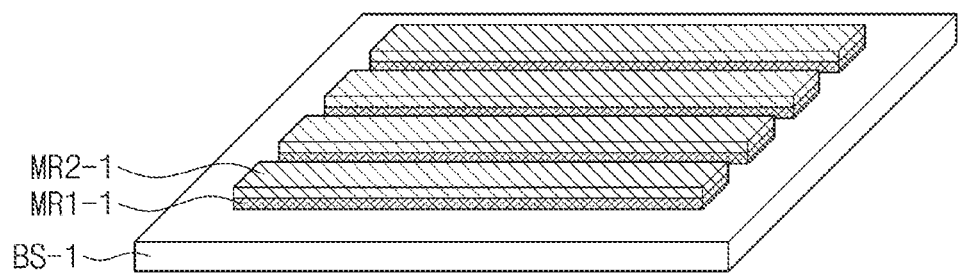

Referring to FIG. 8C, the first plating lines MR2-1 may be disposed or formed on the first metal lines MR1-1. Each of the first plating lines MR2-1 may be formed on a corresponding one of the first metal lines MR1-1 by a plating process. In FIG. 8C, the first plating lines MR2-1 are disposed on only top surfaces of the first metal lines MR1-1. However, the inventive concept is not limited thereto. In an exemplary embodiment of the inventive concept, the first plating lines MR2-1 may be disposed to also cover side surfaces of the first metal lines MR1-1.

Figure 8D:
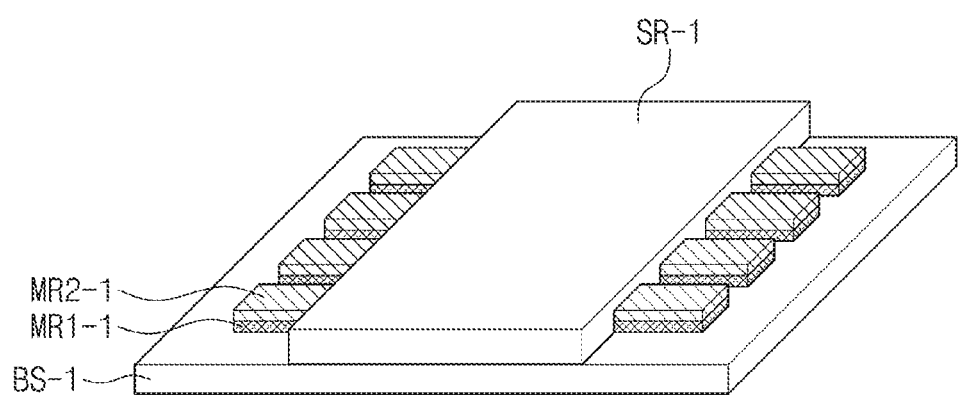

Referring to FIG. 8D, the first protective layer SR-1 may be disposed to cover portions of the first metal lines MR1-1 and portions of the first plating lines MR2-1.

Here, the portions covered by the first protective layer SR-1 may be defined as the first interconnection portion NA1 (see FIG. 6) of the first sub-printed circuit board FPC-S1 (see FIG. 6). Portions not covered by the first protective layer SR-1 may be defined as the first connecting portion CA1 (see FIG. 6) and the first bending portion BA1 (see FIG. 6) of the first sub-printed circuit board FPC-S1 (see FIG. 6).

Figure 8E:
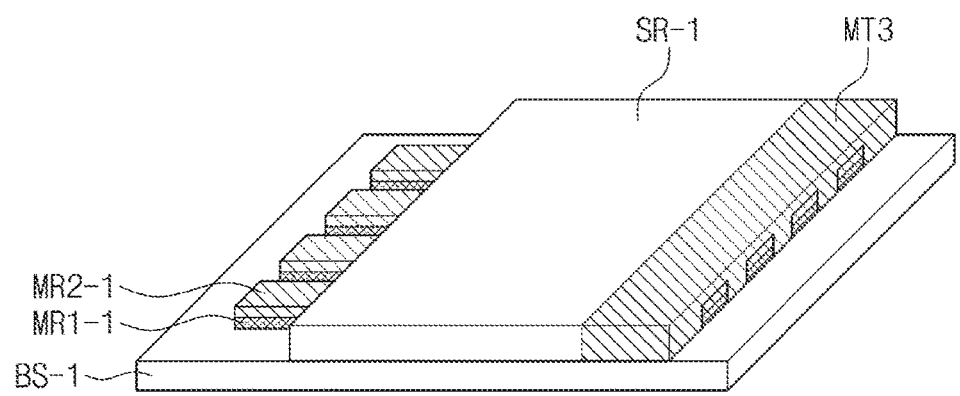

Referring to FIG. 8E, the connection part MT3 may be disposed to cover portions of the first metal lines MR1-1 and portions of the first plating lines MR2-1, which are disposed at one side of the first protective layer SR-1. The connection part MT3 may extend from the first protective layer SR-1.

Here, the portions covered by the connection part MT3 may be defined as the first bending portion BA1 (see FIG. 6) of the first sub-printed circuit board FPC-S1 (see FIG. 6).

Figure 8F:
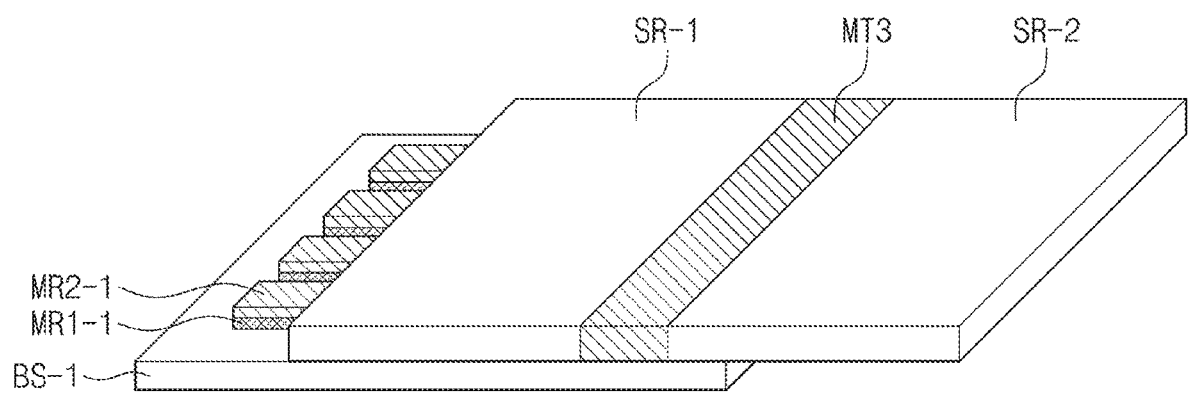

Referring to FIG. 8F, the second protective layer SR-2 may extend from the connection part MT3. A jig may be used in the process of forming the second protective layer SR-2. The jig may be disposed under the second protective layer SR-2 to support the second protective layer SR-2 when the second protective layer SR-2 is formed.

Figure 8G:
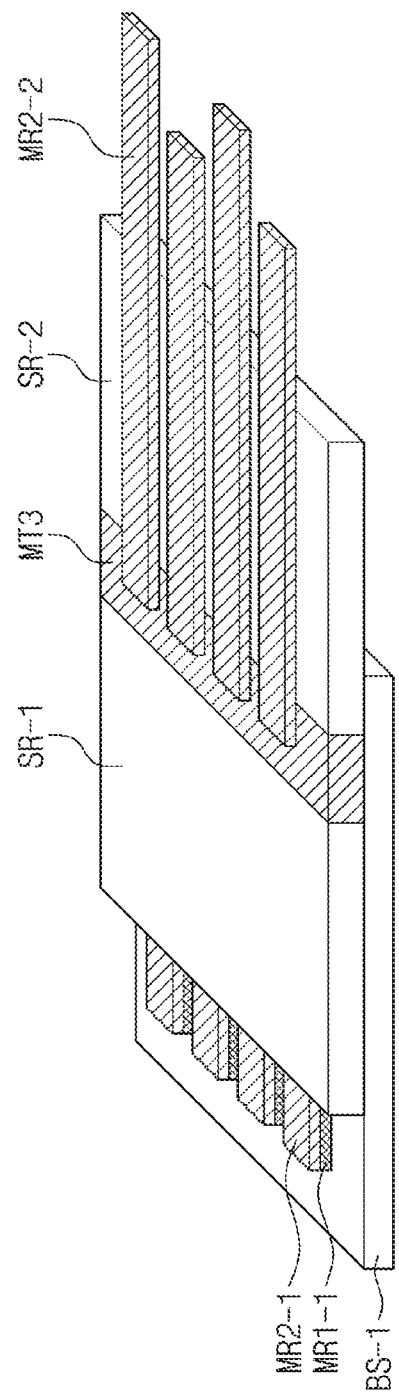

Referring to FIG. 8G, the second plating lines MR2-2 may be disposed or formed on the connection part MT3 and the second protective layer SR-2. The second plating lines MR2-2 may be disposed such that portions of the second plating lines MR2-2 laterally protrude from the second protective layer SR-2.

Here, portions of the second plating lines MR2-2, which overlap with the connection part MT3, may be defined as the second bending portion BA2 (see FIG. 6) of the second sub-printed circuit board FPC-S2 (see FIG. 6). In addition, portions of the second plating lines MR2-2, which overlap with the second protective layer SR-2, may be defined as the second interconnection portion NA2 (see FIG. 6) of the second sub-printed circuit board FPC-S2 (see FIG. 6). Furthermore, the portions of the second plating lines MR2-2, which laterally protrude from the second protective layer SR-2, may be defined as the second connecting portion CA2 (see FIG. 6) of the second sub-printed circuit board FPC-S2 (see FIG. 6).

A jig may be used in the process of forming the second plating lines MR2-2. The jig may be disposed under the second plating lines MR2-2 to support the second plating lines MR2-2 when the second plating lines MR2-2 are formed.

Referring to FIG. 8H, the second metal lines MR1-2 may be disposed on the second plating lines MR2-2.

Referring to FIG. 8I, the second flexible base member BS-2 may be disposed on the second metal lines MR1-2.

In an exemplary embodiment of the inventive concept, each of the first and second sub-printed circuit boards FPC-S1 and FPC-S2 (see FIG. 6) may be formed through the processes described with reference to FIGS. 8A to 8D. Thereafter, the first sub-printed circuit board FPC-S1 (see FIG. 6) may be connected to the second sub-printed circuit board FPC-S2 (see FIG. 6) through the connection part MT3, thus manufacturing the printed circuit board FPC.

When the printed circuit board according to exemplary embodiments of the inventive concept is bent, a crack may not occur at the bent portion of the printed circuit board.

Thus, the display device including the printed circuit board may normally receive electrical signals applied through the printed circuit board.

While the inventive concept has been described with reference to exemplary embodiments thereof, it will be apparent to those of ordinary skill in the art that various changes and modifications in form and details may be made thereto without departing from the spirit and scope of the inventive concept as set forth by the following claims.

What is claimed is:

1. A printed circuit board comprising:
   a first flexible base member;
   a first metal line disposed on the first flexible base member;
   a first plating line disposed on the first metal line, wherein the first plating line comprises a first connecting portion, a first interconnection portion extending from the first connecting portion, and a first bending portion extending from the first interconnection portion;
   a first protective layer covering the first interconnection portion and exposing the first connecting portion and the first bending portion;

a connection part disposed on the first bending portion and connected to the first bending portion;

a second protective layer extending from a side surface of the connection part;

a second plating line disposed on the second protective layer;

a second metal line disposed on the second plating line; and a second flexible base member disposed on the second metal line.

2. The printed circuit board of claim 1, wherein the second plating line comprises:

a second bending portion connected to the connection part;

a second interconnection portion extending from the second bending portion; and a second connecting portion extending from the second interconnection portion, and wherein the second protective layer exposes the second connecting portion.

3. The printed circuit board of claim 2, wherein the first plating line is formed by plating of the first metal line and the second plating line is formed by plating of the second metal line.

4. The printed circuit board of claim 3, wherein the first metal line and the second metal line include copper (Cu).

5. The printed circuit board of claim 4, wherein the first plating line, the second plating line, and the connection part include tin (Sn).

6. The printed circuit board of claim 5, wherein the first flexible base member and the second flexible base member include polyimide.

7. The printed circuit board of claim 6, wherein the first protective layer and the second protective layer include a silicone resin.

8. The printed circuit board of claim 1, wherein each of the first metal line, the second metal line, the first plating line, and the second plating line is provided in plurality.

9. A printed circuit board comprising:

a first sub-printed circuit board;

a second sub-printed circuit board; and a connection part, wherein each of the first and second sub-printed circuit boards comprises:

a flexible base member;

a metal line disposed on the flexible base member;

a plating line disposed on the metal line, wherein the plating line comprises a connecting portion, an interconnection portion extending from the connecting portion, and a bending portion extending from the interconnection portion, and a protective layer covering the interconnection portion and exposing the connecting portion and the bending portion, wherein the bending portion of the first sub-printed circuit board, the bending portion of the second sub-printed circuit board, and the connection part overlap with one another when viewed in a plan view, and wherein the connection part electrically connects the bending portion of the first sub-printed circuit board to the bending portion of the second sub-printed circuit board.

10. The printed circuit board of claim 9, wherein the plating line is formed by plating of the metal line.

11. The printed circuit board of claim 10, wherein the metal line includes copper (Cu), and the plating line includes tin (Sn).

12. The printed circuit board of claim 11, wherein the connection part includes tin (Sn).

13. The printed circuit board of claim 12, wherein the flexible base member includes polyimide.

14. The printed circuit board of claim 13, wherein the protective layer includes a silicone resin.

15. A display device comprising:

a display panel; and a printed circuit board, wherein the display panel comprises:

a first substrate having a surface on which a plurality of color filters is disposed; and a second substrate having a surface on which a plurality of transistors is disposed, wherein the second substrate includes a pad part that is electrically connected to the printed circuit board to receive electrical signals provided from an outside to the plurality of transistors, wherein the printed circuit board comprises:

a first flexible base member;

a first metal line disposed on a surface of the first flexible base member;

a first plating line plated on the first metal line, wherein the first plating line comprises a first connecting portion connected to the pad part, a first interconnection portion extending from the first connecting portion, and a first bending portion extending from the first interconnection portion;

a first protective layer covering the first interconnection portion and exposing the first connecting portion and the first bending portion;

a connection part covering the first bending portion;

a second flexible base member;

a second metal line disposed on a surface of the second flexible base member;

a second plating line plated on the second metal line, wherein the second plating line comprises a second bending portion connected to the connection part, a second interconnection portion extending from the second bending portion, and a second connecting portion extending from the second interconnection portion; and a second protective layer covering the second interconnection portion and exposing the second connecting portion and the second bending portion.

16. The display device of claim 15, further comprising:

a driving circuit connected to the second connecting portion of the printed circuit board.

17. The display device of claim 16, wherein the connection part overlaps with the first bending portion and the second bending portion when viewed in a plan view, and wherein the printed circuit board is bent with respect to the connection part.

18. The display device of claim 17, further comprising:

a backlight unit configured to provide light to the display panel, wherein the first substrate is disposed between the backlight unit and the second substrate.

19. The display device of claim 18, wherein the backlight unit is disposed between the driving circuit and the first substrate.

20. The display device of claim 15, wherein the first and second metal lines include copper (Cu), the first and second plating lines include tin (Sn), and the first and second flexible base members include polyimide.

* * * * *